(12) United States Patent
Jin et al.

(10) Patent No.: US 7,627,801 B2
(45) Date of Patent: *Dec. 1, 2009

(54) METHODS AND APPARATUS FOR ENCODING LDPC CODES

(75) Inventors: Hui Jin, Annendale, NJ (US); Tom Richardson, South Orange, NJ (US); Vladimir Novichkov, Glenview, IL (US)

(73) Assignee: QUALCOMM Incorporated, San Diego, CA (US)

( * ) Notice: Subject to any disclaimer, the term of this patent is extended or adjusted under 35 U.S.C. 154(b) by 898 days.

This patent is subject to a terminal disclaimer.

(21) Appl. No.: 11/174,790

(22) Filed: Jul. 5, 2005

(65) Prior Publication Data

US 2005/0246611 A1 Nov. 3, 2005

Related U.S. Application Data

(63) Continuation of application No. 10/618,325, filed on Jul. 11, 2003, now Pat. No. 6,961,888.

(60) Provisional application No. 60/404,810, filed on Aug. 20, 2002, provisional application No. 60/450,245, filed on Feb. 26, 2003.

(51) Int. Cl.
*H03M 13/00* (2006.01)
*H03M 13/05* (2006.01)

(52) U.S. Cl. .................................................. 714/757
(58) Field of Classification Search .................. 714/757
See application file for complete search history.

(56) References Cited

U.S. PATENT DOCUMENTS 3,542,756 A 11/1970 Gallager
3,665,396 A 5/1972 Forney, Jr.
4,128,880 A * 12/1978 Cray, Jr. ........................ 712/4
4,295,218 A 10/1981 Tanner
4,710,867 A * 12/1987 Watanabe ...................... 712/8
4,916,649 A * 4/1990 Yorozu et al. ............... 708/404
5,157,671 A 10/1992 Karplus
5,271,042 A 12/1993 Borth et al.
5,293,489 A 3/1994 Furui et al.
5,313,609 A 5/1994 Baylor et al.

(Continued)

OTHER PUBLICATIONS

Richardson et al. "The capacity of low-density parity-check codes under message-passing Decoding", IEEE Transactions on Information Theory; pp. 599-618, Feb. 2001, (same inventor) whole document.

(Continued)

*Primary Examiner*—Stephen M Baker
(74) *Attorney, Agent, or Firm*—Kenneth V. Vu; James K. O'Hare

(57) ABSTRACT

Methods and apparatus for encoding codewords which are particularly well suited for use with low density parity check (LDPC) codes and long codewords are described. The described methods allow encoding graph structures which are largely comprised of multiple identical copies of a much smaller graph. Copies of the smaller graph are subject to a controlled permutation operation to create the larger graph structure. The same controlled permutations are directly implemented to support bit passing between the replicated copies of the small graph. Bits corresponding to individual copies of the graph are stored in a memory and accessed in sets, one from each copy of the graph, using a SIMD read or write instruction. The graph permutation operation may be implemented by simply reordering bits, e.g., using a cyclic permutation operation, in each set of bits read out of a bit memory so that the bits are passed to processing circuits corresponding to different copies of the small graph.

20 Claims, 13 Drawing Sheets

U.S. PATENT DOCUMENTS

| | | | |
|---|---|---|---|
| 5,396,518 | A | 3/1995 | How |
| 5,457,704 | A | 10/1995 | Hoeher et al. |
| 5,526,501 | A | 6/1996 | Shams |
| 5,615,298 | A | 3/1997 | Chen |
| 5,671,221 | A | 9/1997 | Yang |
| 5,860,085 | A | 1/1999 | Stormon et al. |
| 5,864,703 | A | 1/1999 | Van Hook et al. |
| 5,867,538 | A | 2/1999 | Liu |
| 5,892,962 | A | 4/1999 | Cloutier |
| 5,933,650 | A | 8/1999 | Van Hook et al. |
| 5,968,198 | A | 10/1999 | Hassan |
| 6,002,881 | A | 12/1999 | York et al. |
| 6,073,250 | A | 6/2000 | Luby et al. |
| 6,081,909 | A | 6/2000 | Luby et al. |
| 6,081,918 | A | 6/2000 | Spielman |
| 6,163,870 | A | 12/2000 | Luby et al. |
| 6,195,777 | B1 | 2/2001 | Luby et al. |
| 6,247,158 | B1 | 6/2001 | Smallcomb |
| 6,266,758 | B1 | 7/2001 | Van Hook et al. |
| 6,298,438 | B1 | 10/2001 | Thayer et al. |
| 6,339,834 | B1 | 1/2002 | Crozier et al. |
| 6,397,240 | B1 | 5/2002 | Fernando et al. |
| 6,438,180 | B1 | 8/2002 | Kavcic et al. |
| 6,452,517 | B1 * | 9/2002 | Vinitzky .................... 341/106 |
| 6,473,010 | B1 | 10/2002 | Vitayev et al. |
| 6,484,284 | B2 | 11/2002 | Smallcomb |
| 6,526,538 | B1 | 2/2003 | Hewitt |
| 6,633,856 | B2 | 10/2003 | Richardson et al. |
| 6,718,504 | B1 | 4/2004 | Coombs et al. |
| 6,731,700 | B1 | 5/2004 | Yakhnich et al. |
| 6,754,804 | B1 | 6/2004 | Hudepohl et al. |
| 6,957,375 | B2 | 10/2005 | Richardson et al. |
| 7,062,637 | B2 * | 6/2006 | Ganapathy et al. ........... 712/221 |
| 7,133,853 | B2 * | 11/2006 | Richardson et al. ........... 706/15 |
| 7,154,941 | B2 * | 12/2006 | Kannan et al. ............. 375/222 |
| 7,159,099 | B2 * | 1/2007 | Lucas et al. ................. 712/218 |
| 7,237,171 | B2 * | 6/2007 | Richardson ................. 714/752 |
| 2004/0034828 | A1 | 2/2004 | Hocevar |

OTHER PUBLICATIONS

Paranchych et al. "Performance of a digital symbol synchronizer in cochannel interference and noise", IEEE Transactions on Communications, pp. 1945-1954; Nov. 2000, whole document.

NN77112415. "Digital Encoding of Wide Range Dynamic Analog Signals", IBM Tech. Disclosure Bulletin, Nov. 1, 1997, vol. No. 20; Issue No. 6; pp. 2415-2417, whole document.

NN9210335. "Hierarchical Coded Modulation of Data with Fast Decaying Probability Distributions", IBM Tech. Disclosure Bulletin, Oct. 1992, vol. No. 35; Issue No. 5; pp. 335-336, whole document.

Sorokine, V. et al. Innovative coding scheme for spread-spectrum communications, The Ninth IEEE International Symposium on Indoor and Mobile Radio Communications, pp. 1491-1495, vol. 3; Sep. 1998, whole document.

T. Moors and M. Veeraraghavan, "Preliminary specification and explanation of Zing: An end-to-end protocol for transporting bulk data over optical circuits", pp. 1-55 (May 2001).

T. Richardson and R. Urbanke, "The Capacity of Low-Density Parity-Check Codes under Message-Passing Decoding", pp. 1-44 (Mar. 2001).

T. Richardson, A. Shokrollahi, R. Urbanke, "Design of Capacity-Approaching Irregular Low-Density Parity-Check Codes", pp. 1-43 (Mar. 2001).

T. Richardson and R. Urbanke, "An Introduction to the Analysis of Iterative Coding Systems", pp. 1-36.

Saied Hemati, Amir H. Banihashemi, VLSI circuits: Iterative decoding in analog CMOS, Proceedings of the $13^{th}$ ACM Great Lakes Symposium on VLSI Apr. 2003, pp. 15-20.

Mohammad M. Mansour, Naresh R. Shanbhag, Session 11: Low-power VLSI decoder architectures for LDPC codes, Proceedings of the 2002 international symposium on Low power electronics and design, Aug. 2002, pp. 284-289.

W. W. Peterson and E.J. Weldon, Jr., "Error-Correcting Codes", Second Edition, The Massachusetts Institute of Technology, pp. 212-213, 261-263, 263, (1986).

R. Blahut, "Theory and Practice of Error Control Codes", Library of Congress Cataloging in Publication Data, pp. 47-49, (May 1984).

PCT International Search Report or the Declaration, PCT/US2002/040573 pp. 1-5, dated Aug. 23, 2004.

Boutillon, et al., Decoder-First code Design, "Proceedings International Symposium in Turbo Codes and Related Topics", Sep. 2001, pp. 459-462.

Sorokine, et al., Innovative Coding Scheme for Spread Spectrum Communications, "International Symposium on Personal Indoor and Mobile Radio Communications", Sep. 1998, pp. 1491-1495.

Sorkine, et al., Gallagher Codes of CDMA Applications-Part II: Implementations, Complexity, and System Capacity, IEEE Transactions on Communications, vol. 48, Nov. 11, 2000, pp. 1818-1828.

Zhang, et al., VLSI Implementation- Oriented (3, K)- Regular Low-Density Parity Check Codes, SiPS 2001, Sep. 2001 pp. 25-36.

Mansour et al., "On the Architecture- Aware Structure of LDPC Codes from Generalized Ramanujan Graphs and their Decoder Architectures," 2003 Conference on Information Sciences and Systems, Mar. 2002.

Wolfram Research, "Group Algebra," downloaded from http://mathworld.wolfram.com/GroupRing.html on Dec. 30, 2004, p. 1 of 2.

Peterson, et al., "Error-Correcting Codes", MIT Press, 1972, pp. 212-213, 261-263, 362.

Blahut, "Theory and Practice Error Control Codes", Addison-Wesley Publishing, pp. 47-49, May 1984.

* cited by examiner $$H = \begin{bmatrix} 1 & 1 & 1 & 1 & 0 & 1 & 1 & 0 & 0 & 0 \\ 0 & 0 & 1 & 1 & 1 & 0 & 1 & 1 & 0 & 1 \\ 0 & 1 & 0 & 1 & 0 & 1 & 0 & 1 & 1 & 1 \\ 1 & 0 & 1 & 0 & 1 & 1 & 0 & 1 & 1 & 0 \\ 1 & 1 & 0 & 0 & 1 & 0 & 1 & 0 & 1 & 1 \end{bmatrix} \quad X = \begin{bmatrix} X_1 \\ X_2 \\ X_3 \\ X_4 \\ X_5 \\ X_6 \\ X_7 \\ X_8 \\ X_9 \\ X_{10} \end{bmatrix}$$

Figure 2

$$H' = \begin{bmatrix} 1 & 1 & 1 & 0 & 0 \\ 0 & 1 & 1 & 1 & 0 \\ 1 & 1 & 0 & 0 & 1 \\ 1 & 0 & 0 & 1 & 1 \end{bmatrix} = \begin{bmatrix} A & B & T \\ C & D & E \end{bmatrix} \quad \text{701}$$

$$A = \begin{bmatrix} 1 \\ 0 \\ 1 \end{bmatrix} \qquad B = \begin{bmatrix} 1 \\ 1 \\ 1 \end{bmatrix} \qquad T = \begin{bmatrix} 1 & 0 & 0 \\ 1 & 1 & 0 \\ 0 & 0 & 1 \end{bmatrix}$$

$$C = [1] \qquad D = [0] \qquad E = \begin{bmatrix} 0 & 1 & 1 \end{bmatrix}$$

$$\begin{bmatrix} A & B & T \\ -ET^{-1}A + C & -ET^{-1}B + D & 0 \end{bmatrix} = \begin{bmatrix} 1 & 1 & 1 & 0 & 0 \\ 0 & 1 & 1 & 1 & 0 \\ 1 & 1 & 0 & 0 & 1 \\ 1 & 1 & 0 & 0 & 0 \end{bmatrix}$$

$$\phi = -ET^{-1}B + D = [1] \qquad \phi^{-1} = [1]$$

$As = \begin{bmatrix} 1 \\ 0 \\ 1 \end{bmatrix}$  802

$T^{-1}As = \begin{bmatrix} 1 \\ 1 \\ 1 \end{bmatrix}$  803

$ET^{-1}As = [0]$  804

$ET^{-1}As + Cs = [1]$  805

$p_1 = \phi^{-1}(ET^{-1}As + Cs) = [1]$  806

$Bp_1 = \begin{bmatrix} 1 \\ 1 \\ 1 \end{bmatrix}$  807

$Bp_1 + As = \begin{bmatrix} 0 \\ 1 \\ 0 \end{bmatrix}$  808

$p_2 = T^{-1}(Bp_1 + As) = \begin{bmatrix} 0 \\ 1 \\ 0 \end{bmatrix}$  809

$x = \begin{bmatrix} 1 \\ 1 \\ 0 \\ 1 \\ 0 \end{bmatrix}$  810

$$H = \left[\begin{array}{ccc|ccc|ccc|ccc|ccc} 0 & 1 & 0 & 0 & 1 & 0 & 0 & 0 & 1 & 0 & 0 & 0 & 0 & 0 & 0 \\ 0 & 0 & 1 & 0 & 0 & 1 & 1 & 0 & 0 & 0 & 0 & 0 & 0 & 0 & 0 \\ 1 & 0 & 0 & 1 & 0 & 0 & 0 & 1 & 0 & 0 & 0 & 0 & 0 & 0 & 0 \\ \hline 0 & 0 & 1 & 0 & 0 & 0 & 0 & 0 & 0 & 1 & 0 & 0 & 1 & 0 & 0 \\ 1 & 0 & 0 & 0 & 0 & 0 & 0 & 0 & 0 & 0 & 1 & 0 & 0 & 1 & 0 \\ 0 & 1 & 0 & 0 & 0 & 0 & 0 & 0 & 0 & 0 & 0 & 1 & 0 & 0 & 1 \\ \hline 1 & 0 & 0 & 0 & 0 & 1 & 0 & 0 & 0 & 0 & 0 & 0 & 0 & 1 & 0 \\ 0 & 1 & 0 & 1 & 0 & 0 & 0 & 0 & 0 & 0 & 0 & 0 & 0 & 0 & 1 \\ 0 & 0 & 1 & 0 & 1 & 0 & 0 & 0 & 0 & 0 & 0 & 0 & 1 & 0 & 0 \\ \hline 0 & 0 & 0 & 1 & 0 & 0 & 0 & 1 & 0 & 0 & 0 & 1 & 0 & 0 & 0 \\ 0 & 0 & 0 & 0 & 1 & 0 & 0 & 0 & 1 & 1 & 0 & 0 & 0 & 0 & 0 \\ 0 & 0 & 0 & 0 & 0 & 1 & 1 & 0 & 0 & 0 & 1 & 0 & 0 & 0 & 0 \end{array}\right] = \begin{bmatrix} \sigma^1 & \sigma^1 & \sigma^2 & 0 & 0 \\ \sigma^2 & 0 & 0 & \sigma^0 & \sigma^0 \\ \sigma^0 & \sigma^1 & 0 & 0 & \sigma^2 \\ 0 & \sigma^0 & \sigma^1 & \sigma^2 & 0 \end{bmatrix}$$

Figure 11

|  | $x_1$ | | | $x_2$ | | | $x_3$ | | | $x_4$ | | | $x_5$ | | |
|---|---|---|---|---|---|---|---|---|---|---|---|---|---|---|---|
| $x_1$ | 1,1 | 1,2 | 1,3 | 1,4 | 1,5 | 1,6 | 1,7 | 1,8 | 1,9 | 1,10 | 1,11 | 1,12 | | | |
| $x_2$ | 2,1 | 2,2 | 2,3 | 2,4 | 2,5 | 2,6 | 2,7 | 2,8 | 2,9 | 2,10 | 2,11 | 2,12 | | | |
| $x_3$ | 3,1 | 3,2 | 3,3 | 3,4 | 3,5 | 3,6 | 3,7 | 3,8 | 3,9 | 3,10 | 3,11 | 3,12 | | | |

← 1402'
← 1402''
← 1402'''

|  | $c_1$ | | | $c_2$ | | | $c_3$ | | | $c_4$ | | |
|---|---|---|---|---|---|---|---|---|---|---|---|---|
| $c_1$ | 2,1 | 2,4 | 3,7 | 3,2 | 1,9 | 1,11 | 1,3 | 3,5 | 2,12 | 1,6 | 2,8 | 3,10 |
| $c_2$ | 3,1 | 3,4 | 1,7 | 1,2 | 2,9 | 2,11 | 2,3 | 1,5 | 3,12 | 2,6 | 3,8 | 1,10 |
| $c_3$ | 1,1 | 1,4 | 2,7 | 2,2 | 3,9 | 3,11 | 3,3 | 2,5 | 1,12 | 3,6 | 1,8 | 2,10 |

$$H' = \begin{bmatrix} \sigma^1 & \sigma^1 & \sigma^2 & 0 & 0 \\ 0 & \sigma^0 & \sigma^1 & \sigma^2 & 0 \\ \sigma^0 & \sigma^1 & 0 & 0 & \sigma^2 \\ \sigma^2 & 0 & 0 & \sigma^0 & \sigma^0 \end{bmatrix}$$

1502

$$A = \begin{bmatrix} \sigma^1 \\ 0 \\ \sigma^0 \end{bmatrix}$$

1503

$$B = \begin{bmatrix} \sigma^1 \\ \sigma^0 \\ \sigma^1 \end{bmatrix}$$

1504

$$T = \begin{bmatrix} \sigma^2 & 0 & 0 \\ \sigma^1 & \sigma^2 & 0 \\ 0 & 0 & \sigma^2 \end{bmatrix}$$

1505

$$C = [\sigma^2]$$

1506

$$D = [0]$$

1507

$$E = \begin{bmatrix} 0 & \sigma^0 & \sigma^0 \end{bmatrix}$$

1508

$$\begin{bmatrix} A & B & T \\ -ET^{-1}A + C & -ET^{-1}B + D & 0 \end{bmatrix} = \begin{bmatrix} \sigma^1 & \sigma^1 & \sigma^2 & 0 & 0 \\ 0 & \sigma^0 & \sigma^1 & \sigma^2 & 0 \\ \sigma^0 & \sigma^1 & 0 & 0 & \sigma^2 \\ \sigma^2 & \sigma^2 & 0 & 0 & 0 \end{bmatrix}$$

1509

$$\phi = [\sigma^2]$$

1510

$$\phi^{-1} = [\sigma^1]$$

Figure 13

$$s = \begin{bmatrix} 1 \\ 0 \\ 0 \end{bmatrix} \quad Cs = \begin{bmatrix} 0 \\ 1 \\ 0 \end{bmatrix} \quad As = \begin{bmatrix} 0 \\ 0 \\ 1 \\ 0 \\ 0 \\ 0 \\ 1 \\ 0 \\ 0 \end{bmatrix} \quad T^{-1}As = \begin{bmatrix} 0 \\ 1 \\ 0 \\ 0 \\ 0 \\ 1 \\ 0 \\ 0 \\ 1 \end{bmatrix}$$

$$ET^{-1}As = \begin{bmatrix} 0 \\ 0 \\ 0 \end{bmatrix} \quad ET^{-1}As + Cs = \begin{bmatrix} 0 \\ 1 \\ 0 \end{bmatrix} \quad p_1 = \phi^{-1}(ET^{-1}As + Cs) = \begin{bmatrix} 1 \\ 0 \\ 0 \end{bmatrix}$$

$$Bp_1 = \begin{bmatrix} 0 \\ 0 \\ 1 \\ 1 \\ 0 \\ 0 \\ 0 \\ 0 \\ 1 \end{bmatrix} \quad Bp_1 + As = \begin{bmatrix} 0 \\ 0 \\ 0 \\ 1 \\ 0 \\ 0 \\ 1 \\ 0 \\ 1 \end{bmatrix} \quad p_2 = T^{-1}(Bp_1 + As) = \begin{bmatrix} 0 \\ 0 \\ 0 \\ 0 \\ 0 \\ 1 \\ 0 \\ 1 \\ 1 \end{bmatrix} \quad x = \begin{bmatrix} 1 \\ 0 \\ 0 \\ 1 \\ 0 \\ 0 \\ 0 \\ 0 \\ 0 \\ 0 \\ 0 \\ 1 \\ 0 \\ 1 \\ 1 \end{bmatrix}$$

Figure 14

METHODS AND APPARATUS FOR ENCODING LDPC CODES

RELATED APPLICATIONS

The present application is a continuation of U.S. patent application Ser. No. 10/618,325, filed on Jul. 11, 2003, now U.S Pat. No. 6,961,888, which claims the benefit of U.S. Provisional Patent Application Ser. No. 60/404,810 filed Aug. 20, 2002 titled "METHODS AND APPARATUS FOR ENCODING LDPC CODES" and U.S. Provisional Patent Application Ser. No. 60/450,245 filed Feb. 26, 2003 titled "PRODUCT LIFTINGS OF LOW-DENSITY PARITY-CHECK (LDPC) CODES" each of which is hereby expressly incorporated by reference.

FIELD OF THE INVENTION

The present invention is directed to methods and apparatus for encoding data for the purpose of detecting and/or correcting errors in binary data, e.g., through the use of parity check codes such as low density parity check (LDPC) codes.

BACKGROUND

Error correcting codes are ubiquitous in communications and data storage systems. Recently considerable interest has grown in a class of codes known as low-density parity-check (LDPC) codes.

LDPC codes are often represented by bipartite graphs, called Tanner graphs, in which one set of nodes, the variable nodes, correspond to bits of the codeword and the other set of nodes, the constraint nodes, sometimes called check nodes, correspond to the set of parity-check constraints which define the code. Edges in the graph connect variable nodes to constraint nodes. A variable node and a constraint node are said to be neighbors if they are connected by an edge in the graph. For simplicity, we generally assume that a pair of nodes is connected by at most one edge.

A bit sequence associated one-to-one with the variable nodes is a codeword of the code if and only if, for each constraint node, the bits neighboring the constraint (via their association with variable nodes) sum to zero modulo two, i.e., they comprise an even number of ones.

In some cases a codeword may be punctured. This refers to the act of removing or puncturing certain bits from the codeword and not actually transmitting them. When encoding an LDPC code, however, bits which are to be punctured are still determined. Thus, puncturing has little or no impact on the encoding process. For this reason we will ignore the possibility of puncturing in the remainder of this application.

The decoders and decoding algorithms used to decode LDPC codewords operate by exchanging messages within the graph along the edges and updating these messages by performing computations at the nodes based on the incoming messages. Such algorithms are generally referred to as message passing algorithms. Each variable node in the graph is initially provided with a soft bit, termed a received value, that indicates an estimate of the associated bit's value as determined by observations from, e.g., the communications channel. The encoding process, which is the focus of this application, also operates in part along the edges of the graph but the connection is less precise.

The number of edges attached to a node, i.e., a variable node or constraint node, is referred to as the degree of the node. A regular graph or code is one for which all variable nodes have the same degree, j say, and all constraint nodes have the same degree, k say. In this case we say that the code is a (j,k) regular code. These codes were originally invented by Gallager (1961). In contrast to a "regular" code, an irregular code has constraint nodes and/or variable nodes of differing degrees. For example, some variable nodes may be of degree 4, others of degree 3 and still others of degree 2.

While irregular codes can be more complicated to represent and/or implement, it has been shown that irregular LDPC codes can provide superior error correction/detection performance when compared to regular LDPC codes.

While encoding efficiency and high data rates are important, for an encoding and/or decoding system to be practical for use in a wide range of devices, e.g., consumer devices, it is important that the encoders and/or decoders be capable of being implemented at reasonable cost. Accordingly, the ability to efficiently implement encoding/decoding schemes used for error correction and/or detection purposes, e.g., in terms of hardware costs, can be important.

An exemplary bipartite graph 100 determining a (3,6) regular LDPC code of length ten and rate one-half is shown in FIG. 1. Length ten indicates that there are ten variable nodes $V_1$-$V_{10}$, each identified with one bit of the codeword $X_1$-$X_{10}$. The set of variable nodes $V_1$-$V_{10}$ is generally identified in FIG. 1 by reference numeral 102. Rate one half indicates that there are half as many check nodes as variable nodes, i.e., there are five check nodes $C_1$-$C_5$ identified by reference numeral 106. Rate one half further indicates that the five constraints are linearly independent, as discussed below.

While FIG. 1 illustrates the graph associated with a code of length 10, it can be appreciated that representing the graph for a codeword of length 1000 would be 100 times more complicated.

An alternative to the Tanner graph representation of LDPC codes is the parity check matrix representation such as that shown in FIG. 2. In this representation of a code, the matrix H 202, commonly referred to as the parity check matrix, includes the relevant edge connection, variable node and constraint node information. In the matrix H, each column corresponds to one of the variable nodes while each row corresponds to one of the constraint nodes. Since there are 10 variable nodes and 5 constraint nodes in the exemplary code, the matrix H includes 10 columns and 5 rows. The entry of the matrix corresponding to a particular variable node and a particular constraint node is set to 1 if an edge is present in the graph, i.e., if the two nodes are neighbors, otherwise it is set to 0. For example, since variable node $V_1$ is connected to constraint node $C_1$ by an edge, a one is located in the uppermost lefthand corner of the matrix 202. However, variable node $V_5$ is not connected to constraint node $C_1$ so a 0 is positioned in the fifth position of the first row of matrix 202 indicating that the corresponding variable and constraint nodes are not connected. We say that the constraints are linearly independent if the rows of H are linearly independent vectors over GF[2].

In the case of a matrix representation, the codeword X which is to be transmitted can be represented as a vector 206 which includes the bits $X_1$-$X_n$ of the codeword to be processed. A bit sequence $X_1$-$X_n$ is a codeword if and only if the product of the matrix 206 and 202 is equal to zero, that is: Hx=0.

BRIEF DESCRIPTION OF THE FIGURES

FIG. 2 is a matrix representation of the code graphically illustrated in FIG. 1.

FIG. 5 illustrates one possible pre-preprocessing for encoding the exemplary LDPC code illustrated in FIG. 3.

FIG. 6 illustrates the process for encoding an information block given pre-computed matrices in FIG. 5 for the exemplary LDPC code illustrated in FIG. 3.

FIG. 10 illustrates the effect of replacing the 3×3 identity matrices shown in FIG. 9 with cyclic permutation matrices in accordance with one exemplary embodiment of the present invention.

FIG. 12 illustrates how the edges in the code shown in FIG. 11 can be enumerated in order from the variable node side, and how the same edges will appear from the constraint node side after being subject to a cyclic permutation in accordance with the invention.

FIG. 13 illustrates a possible pre-processing step for encoding the exemplary LDPC code illustrated in FIG. 11 in accordance with the present invention.

FIG. 14 illustrates the process for encoding an information block given the pre-computed matrices for the exemplary LDPC code illustrated in FIG. 11 in accordance with the present invention.

SUMMARY OF THE INVENTION

Figure 1:
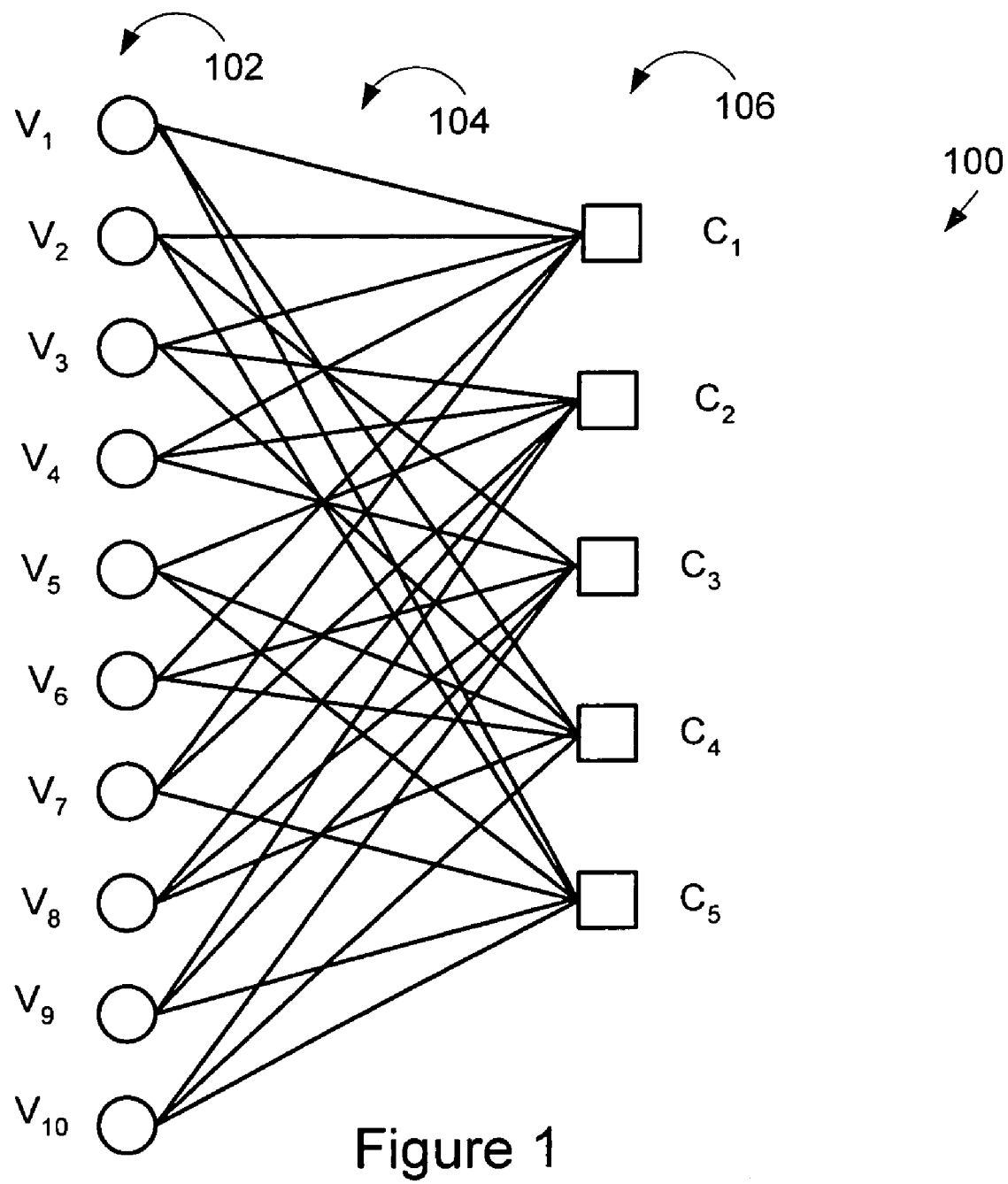
FIG. 1 illustrates a bipartite graph representation of an exemplary regular LDPC code of length ten.

The present invention is directed to methods and apparatus for performing encoding operations on binary data, e.g., multi-bit words. The methods and apparatus of the present invention allow for encoding of LDPC graphs that possess a certain hierarchical structure in which a full LDPC graph appears to be, in large part, made up of multiple copies, Z, e.g., of a Z times smaller graph. The Z graph copies may be identical. For purposes of explaining the invention, we will refer to the smaller graph as the projected graph. We refer to the Z parallel edges as vector edges, and Z parallel nodes as vector nodes. In U.S. patent application Ser. No. 09/975,331 titled "Methods and Apparatus for Performing LDPC Code Encoding and Decoding", filed Oct. 10, 2001, which is hereby expressly incorporated by reference, we describe the benefits that such a structure lends to a decoder implementation. A key observation is that all operations may be done in parallel across all copies of the projected graph. The Z copies are not disjoint, however, they are combined to form one large graph, Z times larger than the projected graph. This is accomplished by interconnecting the Z copies of the projected graph in a controlled manner. Specifically, we allow the Z edges within a vector edge to undergo a permutation, or exchange, between copies of the projected graph as they go, e.g., from the variable node side to the constraint node side. In the vectorized message passing (decoding) process corresponding to the Z parallel projected graphs this exchange is implemented by permuting messages within a vector message as it is passed from one side of the vectorized graph to the other. The encoding process exploits the same idea, but the specification of the sequence of operations is somewhat different. In the encoding process all operations are performed on bit vectors rather than message vectors as in the decoding process.

Consider indexing the projected LDPC graphs by 1, j, ..., Z. In the strictly parallel graph variable nodes in graph j are connected only to constraint nodes in graph j. In accordance with the present invention, we take one vector edge, including one corresponding edge each from each graph copy, and allow a permutation within the Z edges, e.g., we permit the constraint nodes corresponding to the edges within the vector edge to be permuted, e.g., re-ordered. The re-ordering may be performed as rotations. For purposes of explaining the invention henceforth we will refer to the permutations, e.g., re-orderings, within the vector edges as rotations.

A graph may be represented by storing information describing the projected graph and information describing the rotations. Alternatively, the description of the graph may be embodied as a circuit that implements a function describing the graph connectivity. Thus, in accordance with the present invention, a relatively large graph can be represented, e.g., described, using relatively little memory.

Accordingly, the graph representation technique of the present invention facilitates parallel, e.g., vectorized, graph implementations. Furthermore, the graph representation techniques of the present invention can be used to support encoding of regular or irregular graphs, with or without state variables (punctured nodes). Note that normally all nodes belonging to a vector node will have the same degree, so degree information is required only for one projected graph.

In various embodiments, the encoder is made programmable thereby allowing it to be programmed with multiple graph descriptions, e.g., as expressed in terms of a stored sequence of bit vector read/write and rotation information or in terms of an implemented function. Accordingly, the encoders of the present invention can be programmed to encode a large number of different codes, e.g., both regular and irregular. In some particular embodiments the encoder is used for a fixed graph or for fixed degrees. In such embodiments the graph description information may be preprogrammed or implicit. In such cases the encoder may be less flexible than the programmable embodiments but the resources required to support programmability are saved.

Before presenting encoders for encoding large vectorized LDPC graphs, we will discuss general concepts and techniques relating to graph vectorization. The vectorization discussion will be followed by a presentation of exemplary vectorized LDPC encoders that embody the present invention.

Vectorizing LDPC Graphs

For purposes of gaining an understanding of vectorizing LDPC graphs consider a 'small' LDPC code with parity check matrix H. The small graph, in the context of a larger vectorized graph, will be referred to as the projected graph. Let $\Psi$ denote a subset (usually a group) of Z×Z permutation matrices. We assume that the inverses of the permutations in $\Psi$ are also in $\Psi$. Given the small, projected, graph we can form a Z-times larger LDPC graph by replacing each element of H with a Z×Z matrix. The 0 elements of H are replaced with the zero matrix, denoted 0. The 1 elements of H are each replaced with a matrix from $\Psi$. In this manner we 'lift' an LDPC graph to one Z times larger. The complexity of the representation comprises, roughly, the number of bits required to specify the permutation matrices, $|E_H| \log |\Psi|$ plus the complexity required to represent H, where $|E_H|$ denotes the number 1s in H and $|\Psi|$ denotes the number of distinct permutations in $\Psi$. E.g., if $\Psi$ is the space of cyclic permutations then $|\Psi|=Z$. In practice we might have, e.g., Z=16 for n≈1000.

$$H = \begin{bmatrix} 1 & 0 & 1 & 1 & 1 & 0 & 0 \\ 1 & 1 & 1 & 0 & 0 & 1 & 0 \\ 1 & 1 & 0 & 1 & 0 & 0 & 1 \\ 0 & 1 & 0 & 0 & 1 & 1 & 1 \end{bmatrix}$$

$$H = \begin{bmatrix} \sigma_1 & 0 & \sigma_7 & \sigma_9 & \sigma_{11} & 0 & 0 \\ \sigma_2 & \sigma_4 & \sigma_8 & 0 & 0 & \sigma_{13} & 0 \\ \sigma_3 & \sigma_5 & 0 & \sigma_{10} & 0 & 0 & \sigma_{15} \\ 0 & \sigma_6 & 0 & 0 & \sigma_{12} & \sigma_{14} & \sigma_{16} \end{bmatrix}$$

Example: Lifting a small parity check matrix, the $\sigma_i$, i=1,...,16 are elements of $\Psi$ shown here indexed in from the variable node side.

The subset $\Psi$ can in general be chosen using various criteria. One of the main motivations for the above structure is to simplify hardware implementation of decoders and encoders. Therefore, it can be beneficial to restrict $\Psi$ to permutations that can be efficiently implemented in hardware, e.g., in a switching network.

Parallel switching network topologies is a well studied subject in connection with multiprocessor architectures and high speed communication switches. One practical example of a suitable architecture for the permutation subset $\Psi$ is a class of multi-layer switching networks including, e.g., omega (perfect shuffle)/delta networks, log shifter networks, etc. These networks offer reasonable implementation complexity and sufficient richness for the subset $\Psi$. Additionally multi-layer switching networks scale well e.g., their complexity rises as N log N where N is the number of inputs to the network, which makes them especially suitable for massively parallel LDPC decoders. Alternatively, in decoders of the present invention with relatively low levels of parallelism and small Z the subset $\Psi$ of permutations can be implemented in a single layer.

An LDPC graph is said to have "multiple edges" if any pair of nodes is connected by more than one edge. A multiple edge is the set of edges connecting a pair of nodes that are connected by more than one edge. Although it is generally undesirable for an LDPC graph to have multiple edges, in many cases it may be necessary in the construction of vectorized graphs that the projected graph possesses multiple edges. One can extend the notion of a parity check matrix to allow the matrix entries to denote the number of edges connecting the associated pair of nodes. The codeword definition is still the same: the code is the set of 0,1 vectors x satisfying Hx=0 modulo 2. When vectorizing a projected graph with multiple edges, in accordance with the invention, each edge within the multiple edge is replaced with a permutation matrix from $\Psi$ and these matrixes are added to yield the extended parity check matrix of the full code. Thus, a j>1 in the parity check matrix H of the projected graph will be 'lifted' to a sum $\sigma_k+\sigma_{k+1+}\ldots+\sigma_{k+j-1}$, of permutation matrixes from $\Psi$. Usually, one will choose the elements of the sum so that each entry of $\sigma_k+\sigma_{k+1+}\ldots+\sigma_{k+j-1}$ is either 0 or 1, i.e., the full graph has no multiple edges.

The above described lifting appears to have one limitation. Under the above construction both the code length and the length of the encoded data unit must be multiples of Z. This apparent limitation is easily overcome, however. A description of the method used to overcome this limitation can be found in U.S. patent application Ser. No. 09/975,331 which is hereby expressly incorporated by reference and will not be repeated here.

The invention lifts the encoding process analogously, replacing bit operations in the original algorithm to bit vector operations in the lifted algorithm.

At one or more points in the encoding processing, after being read out of memory, the Z bit vectors are subject to a permutation operation, e.g., a re-ordering operation. The re-ordering operation may be a rotation operation, or rotation for short. These rotation operations generally correspond to the rotations associated to the vector edges which interconnect the Z copies of the projected graph to form the single large graph. In the case of encoding, however, some of the required rotations are apparent only after appropriate preprocessing of the LDPC representation.

The rotation may be implemented using a simple switching device that connects, e.g., the bit memory to the bit vector processing unit and re-orders those bits as they pass from the memory to the bit vector processing unit. In such an exemplary embodiment, one of the bits in each bit vector read from memory is supplied to a corresponding one of the Z parallel processing units, within a bit vector processor, as determined by the rotation applied to the bit vector by the switching device. A rotation operation as implemented by the switching device may also or alternatively be applied to the bit vector prior to its being written into memory and after processing.

The stored or computed description of the encoding process for the projected graph may include, e.g., information on the order in which bits in corresponding to a projected graph are to be read out of and/or written in to memory during encoding processing. The bits of the entire large graph are stored in multiple rows, each row corresponding to a different copy of the small graph, the rows being arranged to form columns of bits. Each column of bits represents a bit vector, which can be accessed as a single unit. The number of columns will typically be at least as large as the number of variable nodes in the projected graph, but often it will be larger, the additional columns being used for temporary storage in the encoding process.

It is generally possible to decompose the encoding operation for lifted graphs into a sequence of elementary operations where each elementary operation consists of one of, e.g., reading a column of bits and rotating it, X-ORing that column bit-wise with some accumulated bit vector (possibly 0), and writing the result into some column in memory (usually additional rotation prior to writing is not required). As indicated above, to facilitate the encoding process it may be desirable or necessary to have more memory columns available then those required to store the codeword. In summary, the invention comprises the use of an encoding structure consisting of a switch to rotate bit vectors together with a bit-vector processor capable of performing the elementary operations described above and a control structure to control the sequence of operations performed, thereby specifying an encoding.

Numerous additional advantages, features and aspects of the encoding techniques and encoders of the present invention will be apparent from the detailed description which follows.

DETAILED DESCRIPTION OF THE INVENTION

The encoding process for an LDPC code is a mapping from input information bits to an LDPC codeword. As discussed above, there are many possible forms this mapping can take. The present invention is directed towards a general purpose encoding device enabling fast parallel encoding of the class of LDPC codes supported by the decoder presented in application U.S. patent application Ser. No. 09/975,331. In that application, a certain structured class of LDPC codes was considered and a decoder architecture proposed for them. In this application certain features of the decoder architecture reappear as part of an encoder structure.

For purposes of explaining the invention, we now describe a general purpose approach to encoding LDPC codes. The method is described in detail in a paper by Thomas J. Richardson and Ruediger L. Urbanke, titled "Efficient Encoding of Low Density Parity Check Codes" printed in the IEEE Trans. on Information Theory, pp. 638-656, Vol. 47, Number 2, February 2001.

For purposes of discussion we assume that an m×n parity check matrix, has m<n and has rank m, that is, the rows are linearly independent. When this is not the case redundant rows can be removed without changing the code.

We first describe certain operations which are part of the process of designing an encoder. It should be appreciated that this pre-processing computation is typically performed in software as part of code design and is not part of the actual implementation of the encoder.

The first step in the design of an encoder according to our current method is to rearrange rows and columns to put the matrix H in approximate lower triangular form.

$$H = \begin{bmatrix} A & B & T \\ C & D & E \end{bmatrix}$$

where A is (m−g)×(n−m), B is (m−g)×g, T is (m−g)×(m−g), C is g×(n−m), D is g×g, and E is g×(m−g). The matrix T is lower triangular with all diagonal entries equal to 1. Multiplying H from the left by $$\begin{bmatrix} I & 0 \\ ET^{-1} & I \end{bmatrix} \text{ we get } \begin{bmatrix} A & B & T \\ -ET^{-1}A+C & -ET^{-1}B+D & 0 \end{bmatrix}$$

Define $\phi = (-ET^{-1}B+D)$ and assume that $\phi$ is non-singular. The matrix $\phi^{-1}$ is computed and saved. The case where $\phi$ is not invertible is handled as follows. Assuming the rows of H are linearly independent one can permute columns inside the submatrix $$\begin{bmatrix} A & B \\ C & D \end{bmatrix}$$

to ensure that $\phi$ is invertible. If the rows of H are not linearly independent then some of the rows of H may be removed, so that the remaining rows are linearly independent, without changing the definition of the code. Note that all of the above computation is independent of the data to be encoded is not part of the encoding process per se. These steps are normally performed once as part of encoder design and need not be repeated during encoder use. Let us now consider how data is encoded into a codeword.

Let $x = (s, p_1, p_2)$ denote a codeword where s denotes the systematic part, $p_1$ and $p_2$ combined denote the parity part, $p_1$ has length g and $p_2$ has length (m−g). The encoding problem is to find $p_1$ and $p_2$ given s. The defining equation $Hx^T = 0^T$ splits naturally in to two equations $$As^T + Bp_1^T + Tp_2^T = 0$$

$$(-ET^{-1}A + C)s^T + (-ET^{-1}B + D)p_1^T = 0$$

From the above equation we conclude that $p_1^T = -\phi^{-1}(-ET^{-1}A+C)s^T$. We remark that $(-ET^{-1}A+C)s^T$ can be computed efficiently since all matrices are sparse and, given $As^T$, we find $T^{-1}As^T$ efficiently by solving $Tz = As^T$ for z using block substitution. The matrix $\phi^{-1}$ will be dense in general but g is made small by design and this matrix is precomputed, as discussed above. Thus, one efficiently obtains $p_1^T$. One can now easily and efficiently solve for $P_2^T$ by solving $Tp_2^T = -As^T - Bp_1^T$.

Figure 7:
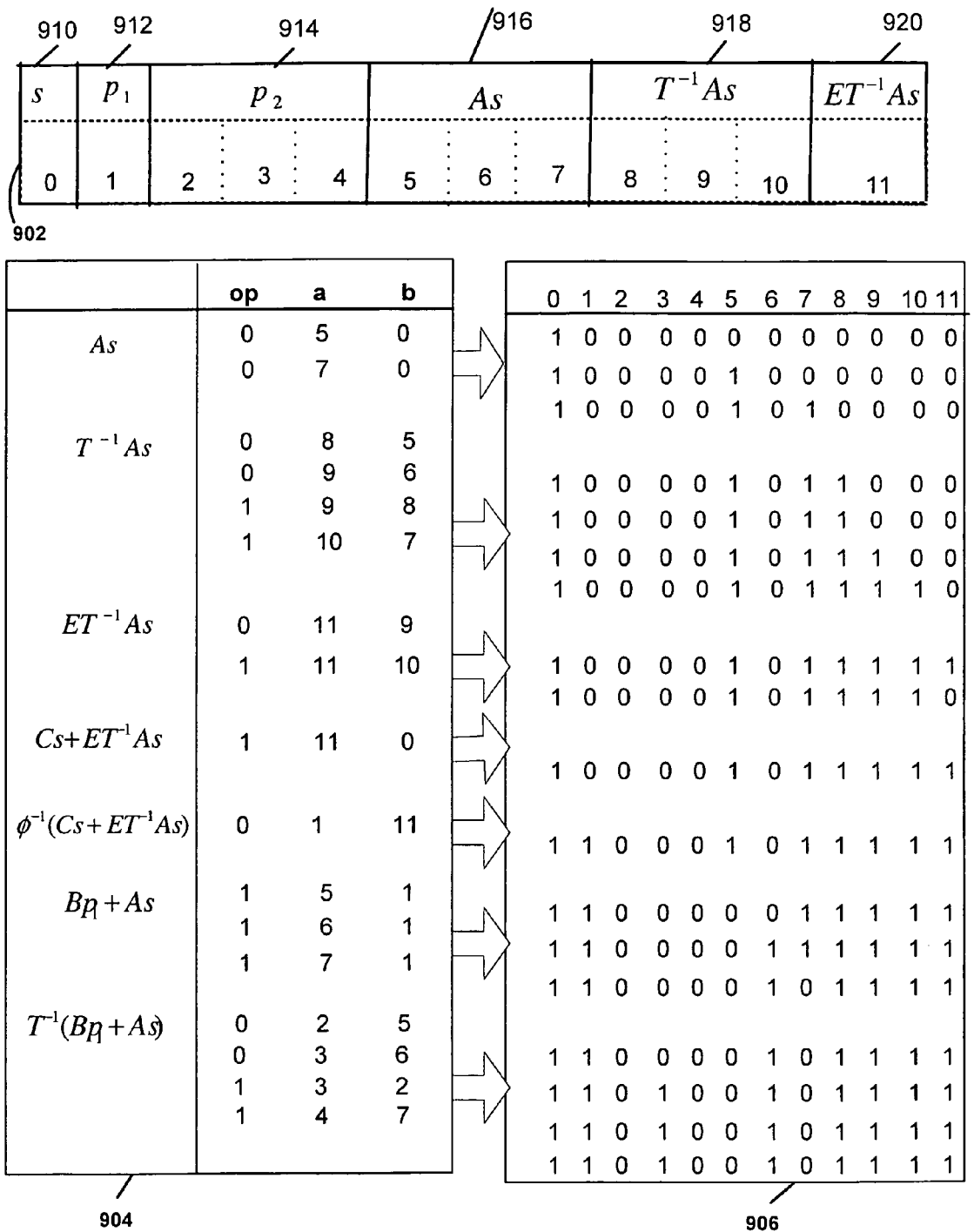
FIG. 7 illustrates a system for performing a serial LDPC encoding operation illustrated in FIG. 6.

An example is presented in FIGS. 6 and 7.

The above description gives a method for encoding any LDPC code. It will be appreciated that many constructions of LDPC codes give rise to other natural encoding mechanisms, e.g. RA codes.

The basic idea underlying our parallelized encoder is to take encoding methods for binary codes, such as described above, and "lift" them along with the parity check matrices into parallel an encoding engine for the "vectorized" LDPC codes.

In a previously filed U.S. patent application Ser. No. 09/975,331 titled "Methods and Apparatus for Decoding LDPC Codes" which is hereby expressly incorporated by reference we described and motivated a structured "vectorized" class of LDPC graphs. The motivation there was to provide for a highly efficient decoder architecture. This application describes a corresponding architecture suitable for encoding the same class of codes. As in the decoder case, the advantages gained are that encoding operations may be performed efficiently and in parallel and the architecture allows the specification of the particular LDPC code to be programmable.

We will now present a simple example of a small LDPC graph and its representation which will be used subsequently in explaining the invention. The discussion of the LDPC graph will be followed by a description of an LDPC encoder which can be used to encode the small graph.

Figures 3, 4:
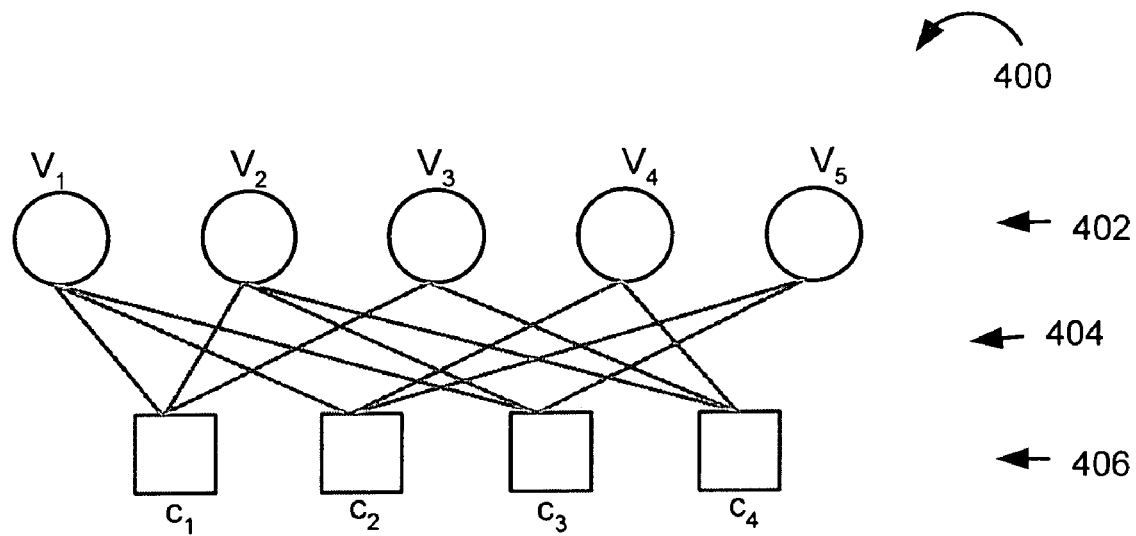
FIG. 3 is a graphical representation of a small LDPC code which is used as the basis of a much larger LDPC code to present an example in accordance with the present invention.
FIG. 4 illustrates the parity check matrix representation of the small LDPC code graphically illustrated in FIG. 3.

FIG. 3 illustrates a simple irregular LDPC code in the form of a graph 400. The code is of length five as indicated by the 5 variable nodes $V_1$ through $V_5$ 402. Four check nodes $C_1$ through $C_4$ 406 are coupled to the variable nodes 402 by a total of 12 edges 404.

FIG. 4 illustrates, using matrices 502, 504, the LDPC code shown in FIG. 3, in parity check matrix form. As discussed above, edges are represented in the permutation matrix H 502 using 1's. Bit $x_i$ is associated to variable node $V_i$.

FIGS. 5 and 6 illustrate the encoding process for the LDPC code shown in FIG. 3. As described earlier, the encoding preprocessing step requires rearranging the rows and columns of the parity check matrix H shown in FIG. 4 into some lower triangular form. One exemplary way of rearrangement is illustrated in FIG. 5, by swapping row 2 and row 4 in the original matrix.

Matrix H 701 shows the different components after rearrangement. For purpose of annotation, let us define a sub-matrix (r1, r2; c1, c2) to be the matrix comprising all the entries with row index in [r1, r2] and column index in [c1, c2] in the original matrix. Matrix A 702 is the sub-matrix (1, 3; 1, 1) of matrix H 701. Matrix B 703 is the sub-matrix (1, 3; 2, 2) of matrix H. Matrix T 704 is the sub-matrix (1, 3; 3, 5) of matrix H, which is of lower triangular form. Matrix C 705 is the sub-matrix (4, 4; 1, 1) of matrix H. Matrix D 706 is the sub-matrix (4, 4; 2, 2) of matrix H. Matrix E 707 is the sub-matrix (4, 4; 3, 5) of matrix H. Derivation of $\phi = (-ET^{-1}B+D)$ by Gaussian elimination is illustrated in 708, where $\phi$ 709 and its inverse $\phi^{-1}$ 710 are obtained.

FIG. 6 illustrates the actual encoding process given an information block s=[1] 801 and pre-computed matrices shown in FIG. 6. Standard multiplication of a vector by a matrix allows computation of As 802, $T^{-1}As$ 803, $ET^{-1}As$ 804, $ET^{-1}As+Cs$ 805, $p_1 = \phi^{-1}(ET^{-1}As+Cs)$ 806, $Bp_1$ 807, $Bp_1+As$ 808, and $p_2=T^{-1}(Bp_1+As)$ 809. Note that multiplication by $T^{-1}$ is performed using back substitution as described earlier. The final result, the coded bits $x=[p_1,p_2,s]$ are shown in vector 810.

Multiplication of a binary vector by a binary matrix can be decomposed into a sequence of simple operations. For example, consider multiplying a binary matrix U (m×n) with a binary vector v (n×1) in a hardware processor. We assume that, prior to multiplication, the vector v is available at some physical location, e.g. memory, starting at index s, and the result is to be stored at location starting at index t. Assume row i, $i \in [0,m-1]$ of matrix U has nonzero entries, i.e. 1's, at columns indexed as $l_{i,1}, l_{i,2}, \ldots, l_{i,k_i}$. Define two instructions—(0 a b) and (1 a b)—as follows: (0 a b) instructs the processor to read out the value at location b and write it to location a; (1 a b) instructs to read but the value at location b and add it to, i.e. x-or with the current value at, location a. In other words, the second operation accumulates the value at location a; the first, overwrites. Now, the multiplication of vector v by U can be decomposed into the following sequence of those two simple operations: $(0\ t\ s+l_{0,1}), (1\ t\ s+l_{0,2}), \ldots, (1\ t\ s+l_{0,k_0}); (0\ t+1\ s+l_{1,1}), (1\ t+1\ s+l_{1,2}), \ldots, (1\ t+1\ s+l_{1,k_1}); \ldots ; (0\ t+m-1\ s+l_{n-1,1}), (1\ t+m-1\ s+l_{n-1,2}), \ldots, (1\ t+m-1\ s+l_{n-1,k_{n-1}})$. The total number of instructions is the same as the number of non-zero entries in the matrix.

FIG. 7 illustrates the encoding process as a sequence of those two simple operations corresponding to the LDPC code shown in FIG. 3. An exemplary memory 902 stores information bits, coded bits, and intermediate variables. In FIG. 7, location 0 of the memory 902 is assigned to store the single information bit s; location 1 is assigned to store parity bit $p_1$; locations 2 to 4 are assigned to store parity bits $p_2$. Additional memory space is provided to hold intermediate values. The exemplary memory 902 provides locations 5 to 7 to store the value of As and later that of $Bp_1+As$; it provides locations 9 to 11 to store $T^{-1}As$; it provides locations 12 to store $ET^{-1}As$.

With respect to the above allocation of memory 902, the encoding process illustrated in FIG. 6 as matrix multiplication with vectors is decomposed into a sequence of operations (0 a b) and (1 a b) listed in Table 904. For clarity, table 904 shows the sequence of instructions, one per row, together with their respective matrix multiplication counterparts. For example, multiplication As is decomposed to two instructions: (0 5 0) followed by (0 7 0). Table 906 shows the contents of memory locations 0 through 11 at the time an instruction shown in the corresponding row on table 904 is executed. The result of executing of instruction on table 904 is shown in the next row of table 906. Suppose we encode the same information bits as in FIG. 6 by storing s=[1] into location 0, as illustrated in the first row of Table 906. Operations executing instruction (0 5 0) followed by instruction (0 7 0) gives result As=(1 0 1) in locations from 5 to 7, as shown in row three of block 906. This is the same result as its counterpart in FIG. 6. Table 906 illustrates the complete encoding process in terms of the content of memory locations 0 through 11 as the sequence of elementary instructions in table 904 is executed.

The sequence instructions of 904 instructions are readily translated into hardware implementation. Straightforward modifications may be made during hardware implementation, e.g., to comply with the memory operation constraints of the utilized hardware.

Figure 8:
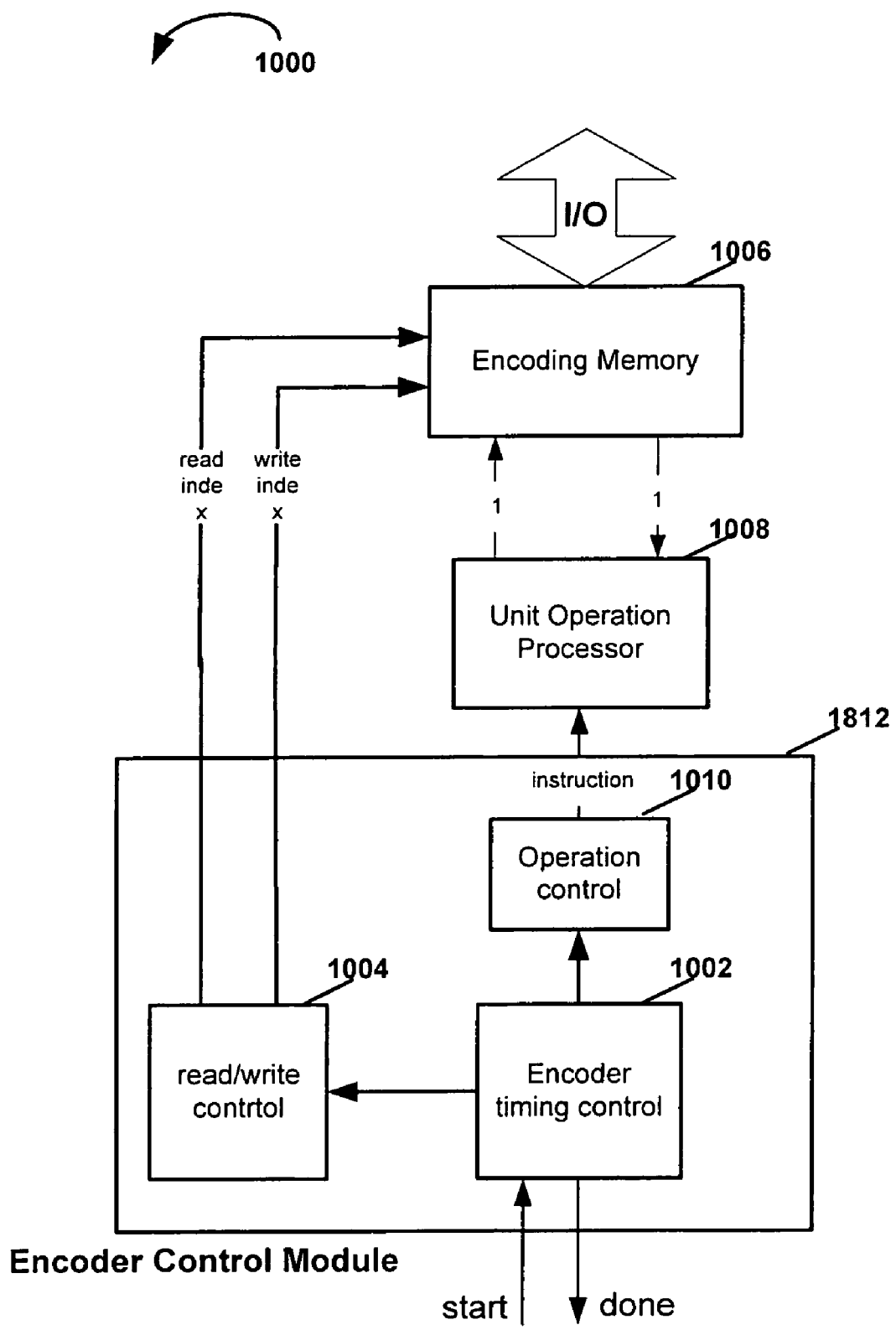
FIG. 8 illustrates an exemplary implementation of an LDPC encoder 1000.

FIG. 8 illustrates an exemplary implementation of a general LDPC encoder 1000. Unit operation processor 1010 performs one of three possible operations indicated by a received instruction. Unit operation processor 1010 either clears a sum bit, xors a sum bit with an a bit read from memory or outputs a sum bit to the memory 1006. Operations to be performed are selected by operation on the control module 1010 and specified to the unit operation processor in the form of one or more instructions. The read/write control module 1004 specifies the order in which encoding memory 1006 is accessed. Timing of the form of both the operation control module 1010 and the read/write control module 1006 are controlled by encoder control module 1002, which determines the data flow of the encoder through timing control signal. Encoding memory 1006 is a dual port memory block which can be written into or read from independently using a SIMD read or write instruction.

We will now discuss in further detail the impact of vectorization on encoding techniques.-*

Given a vectorized LDPC graph one can vectorize the encoding process as follows. The encoder operates as if it were encoding Z copies of the projected LDPC code synchronously and in parallel. Control of the encoding process corresponds to the projected LDPC graph and may be shared across the Z copies. Thus, we describe the encoder as operating on bit vectors, each vector having Z elements. One deviation from purely disjoint parallel encoding of the Z projected graphs is that bits are re-ordered within a bit vector during the encoding process. We refer to this re-ordering operation as a rotation. The rotation implements the permutation operations defined by $\Psi$. Because of the rotations, the processing paths of the Z copies of the projected graph mix, thereby linking them to form a single large graph. Control information which specifies the rotations is needed in addition to the control information required for the projected graph. Fortunately, the rotation control information can be specified using relatively little memory.

While various permutations can be used for the rotations in accordance with the present invention, the use of cyclic permutations is particularly interesting because of the ease with which such permutations can be implemented. For simplicity we will now assume that $\Psi$ comprises the group of cyclic permutations. In this case, our large LDPC graphs are constrained to have a quasi-cyclic structure. For purposes of this example, let N be the number of variable nodes in the graph and let M be the number of constraint nodes in the graph.

First, we assume that both N and M are multiples of Z, N=nZ and M=mZ where Z will denote the order of the cycle.

Let us identify nodes through the use of a double index. Thus, variable node $v_{i,j}$ is the $j^{th}$ variable node from the $i^{th}$ copy of the projected graph. Since $\Psi$ is the group of cyclic permutations, variable node $v_{i,j}$ is connected to a constraint node $c_{a,b}$ if and only if variable node $v_{i+k\ mod\ Z,j}$ is connected to a constraint node $c_{a+k\ mod\ Z,b}$ for $k=1, \ldots, Z$.

The techniques of the present invention for representing a large graph using a much smaller graph representation and rotation information will now be explained further in reference to FIGS. 9 through 16 which relate to vectorization of the exemplary graph 400 in accordance with the invention. The techniques of the invention described with reference to these figures can be applied to much larger LDPC graphs.

In accordance with the present invention, a larger graph can be generated by replicating, i.e., implementing multiple copies, of the small graph shown in FIG. 3 and then performing rotation operations to interconnect the various copies of the replicated graph. For discussion purposes, we refer to the small graph within the larger graph structure as the projected graph.

Figures 9, 10:
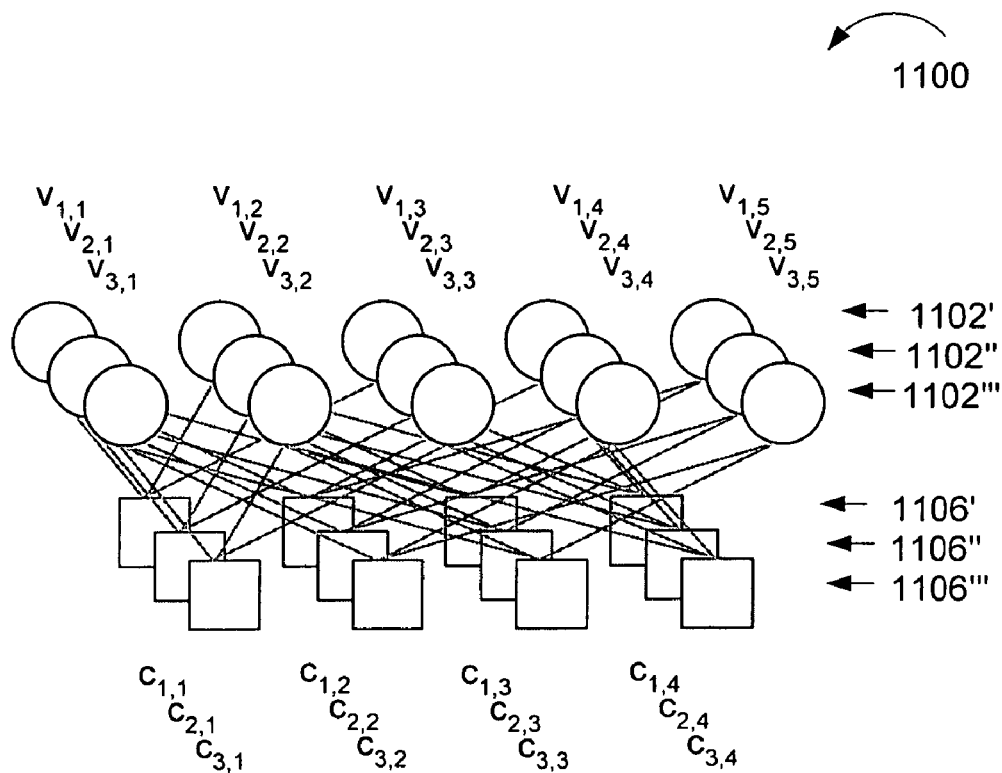
FIG. 9 graphically illustrates the effect of making three copies of the small LDPC graph shown in FIG. 3.
FIG. 10 illustrates the parity check matrix representation of the LDPC graph illustrated in FIG. 8.

FIG. 9 is a graph 1100 illustrating the result of making 3 parallel copies of the small graph illustrated in FIG. 3. Variable nodes 1102', 1102" and 1102'" correspond to the first through third graphs, respectively, resulting from making three copies of the FIG. 3 graph. In addition, check nodes 1106', 1106" and 1106'" correspond to the first through third graphs, respectively, resulting from making the three copies. Note that there are no edges connecting nodes of one of the three graphs to nodes of another one of the three graphs. Accordingly, this copying process, which "lifts" the basic graph by a factor of 3, results in three disjoint identical graphs.

FIG. 10 illustrates the result of the copying process discussed above using matrices 1202 and 1204. Note that to make three copies of the original FIG. 3 graph each non-zero element in the matrix 502 is replaced with a 3×3 identity matrix. Thus, each one in the matrix 502 is replaced with a 3×3 matrix having 1's along the diagonal and 0's everywhere else to produce the matrix 1202. Note that matrix 1202 has 3 times the number of edges that matrix 502 had, 12 edges for each one of the 3 copies of the basic graph shown in FIG. 3. Here, variable $x_{ij}$ corresponds to variable node $v_{ij}$.

Let us briefly discuss how to modify the FIG. 8 encoder 1000 to encode the (Z=3) parallel graphs now defined. The unit operation processor 1010 will be made a vector unit operation processor, able to process 3 identical operations simultaneously in parallel. All outputs from the unit operation processor 1008 will be vectorized, thereby carrying 3 times the data previously carried. Encoding memory 1006 will be made 3 times wider, capable of writing or reading 3 bits in parallel using at the direction of a single SIMD instruction. Outputs from these memories will now be 3-bit wide vectors. The output buffer 908 will also be suitably vectorized with all processing suitably parallelized. However, the unit operation control, ordering control and encoder control module will remain the same as or similar to the like named elements of FIG. 8.

Let us now consider the introduction of rotations into our example. This can be illustrated by replacing each of the 3×3 identity matrixes shown in FIG. 10 with 3×3 cyclic permutation matrices as shown in FIG. 11. Note that there are three possibilities for the cyclic permutation matrix used in FIG. 11. It is possible to indicate the particular permutation matrix to be substituted for an identity matrix by indicating whether the permutation matrix has a "1" located in the first, second or third position in the first row of the permutation matrix. For example, in the case of matrix 1302, beginning at the top left and proceeding to the bottom right corner the rotations could be specified by the sequence (2, 2, 3, 3, 1, 1, 1, 3, 2, 1, 2, 3).

FIG. 12 illustrates the effect of performing the cyclic permutation (rotation) on the constraint node side. Since the permutation is performed from the constraint node side, the relationship between the edges, e.g., ordering, from the variable node side remains unchanged as shown in rows 1402', 1402" and 1402'". From the constraint side, however, the permutation results in edges within a column, e.g., the edges within a specific vector edge, being reordered as shown in rows 1404', 1404", 1404'". This produces interconnections between nodes corresponding to different copies of the projected graph.

Note that as a result of the vector edge permutation, operation, constraint node $C_{1,1}$ is now connected to edge (2,1) as opposed to edge (1,1), constraint node $C_{2-1}$ is coupled to edge (3,1) as opposed to edge (2,1) and constraint node $C_{3-1}$ is coupled to edge (1,1) as opposed to edge (3,1).

We discussed above how to vectorize an encoder to encode Z parallel copies of the projected graph. By introducing switches into the message paths to perform rotations, we encode the LDPC code defined in FIG. 11.

The vector encoding process can be further appreciated by applying the general LDPC encoding procedure previously described in the present document. Instead of working on binary data, the encoder in accordance with the present invention works on a vector of Z bits, corresponding Z parallel copies of the bit in the projected graph. Parity check matrix H comprises entries of Z×Z all zero matrix or Z×Z cyclic permutation matrix represented by $\sigma^k, k \in [0, Z-1]$. Multiplication of cyclic matrix $\sigma^k$ with a Z-bit binary vector is equivalent to right-shifting the vector by k bits. In the field of $GF(2^z)$, the encoding process can be treated the same as the binary data case, with the exception that when testing the invertability of $\phi$, we first bring the matrix back into binary representation.

FIGS. 13 and 14 illustrate an exemplary encoding process for the LDPC code shown in FIG. 11. The encoding preprocessing step rearranges the rows and columns of the parity check matrix H into some lower triangular form. One exemplary rearrangement H' 1501 is illustrated in FIG. 13 H' 1501 is obtained by permuting rows 2 and 4 of the original matrix H' 1302.

In constructing an encoder, preprocessing extracts and stores certain information. Matrix A 1502 is the sub-matrix (1, 3; 1, 1) of matrix H' 1501. Matrix B 1503 is the sub-matrix (1, 3; 2, 2). Matrix T 1504 is the sub-matrix (1, 3; 3, 5), which is of lower triangular form. Matrix C 1505 is the sub-matrix (4, 4; 1, 1). Matrix D 1506 is the sub-matrix (4, 4; 2, 2). Matrix E 1507 is the sub-matrix (4, 4; 3, 5). Derivation of $\phi = (-ET^{-1}B+D)$ by Gaussian elimination is illustrated in 1508 and 1509; its inverse $\phi^{-1}$ 1510 is then computed.

Given the off-line pre-computed matrices, FIG. 14 illustrates the actual encoding process for an exemplary information block s=[100] 1601. Matrix multiplication with vector calculates vectors Cs 1602, As 1604, $T^{-1}As$ 1605, $ET^{-1}As$ 1606, $ET^{-1}As+Cs$ 1607; $p_1=\phi^{-1}(ET^{-1}As+Cs)$ 1608, $Bp_1$ 1609, $Bp_1+As$ 1610, and $p_2=T^{-1}(Bp_1+As)$ 1611. The resulted codeword $x=[s,p_1,p_2]$ is shown in 1612.

Similar to binary matrix multiplication decomposition described on page 21 of the present document and illustrated in FIG. 7, we can as well decompose the above matrix operations in the field of $GF(2^z)$ into a sequence of simple operations when incorporating rotations, i.e. cyclic shifts. We define two instructions—(0 a r b) and (1 a r b)—as follows: (0 a r b) instructs the processor to read out the value at location b, left cyclic-shift it by r, and write the result to location a; (1 a r b) instructs the processor to read out the value at location b, left cyclic-shift it by r, and add the result to the value at location a.

Let us now consider how to decompose a multiplication of matrix U (m×n) comprising entries of Z×Z cyclic matrices or zero matrices with a vector v (n×1) of Z-bit data. Assume prior to multiplication, source data is held at locations s, s+1, . . . , s+n-1 in some memory of Z-bit data width; the result data is to be stored at locations t, . . . , t+m-1 in the same memory. Assume further that row $i, i \in [0, m-1]$ of matrix U has nonzero entries, i.e. $\sigma^k, k \in [0, Z-1]$, at columns $l_{i,1}$, $l_{i,2}, \ldots, l_{i,k_i}$, with cyclic-shift values $u_{i,1}, u_{i,2}, \ldots, u_{i,k_i} \in [0, Z-1]$. Given those assumptions, multiplication of U with v is equivalent to the following sequence of operations: $(0\ t\ u_{0,1}\ s+l_{0,1}), (1\ t\ u_{0,2}\ s+l_{0,2}), \ldots, (1\ t\ u_{0,k_0}\ s+l_{0,k_0}); (0\ t+1\ u_{1,1}\ s+l_{1,1}), (1\ t+1\ u_{1,2}\ s+l_{1,2}), \ldots, (1\ t+1\ u_{1,k_1}\ s+l_{1,k_1}); \ldots; (0\ t+m-1\ u_{n-1,1}\ s+l_{n-1,1})\ (1\ t+m-1\ u_{n-1,2}\ s+l_{n-1,2}), \ldots, (1\ t+m-1\ u_{n-1,k_{n-1}}\ s+l_{n-1,k_{n-1}})$. The total number of instructions is the same as the number of non-zero entries in the matrix.

Figure 15:
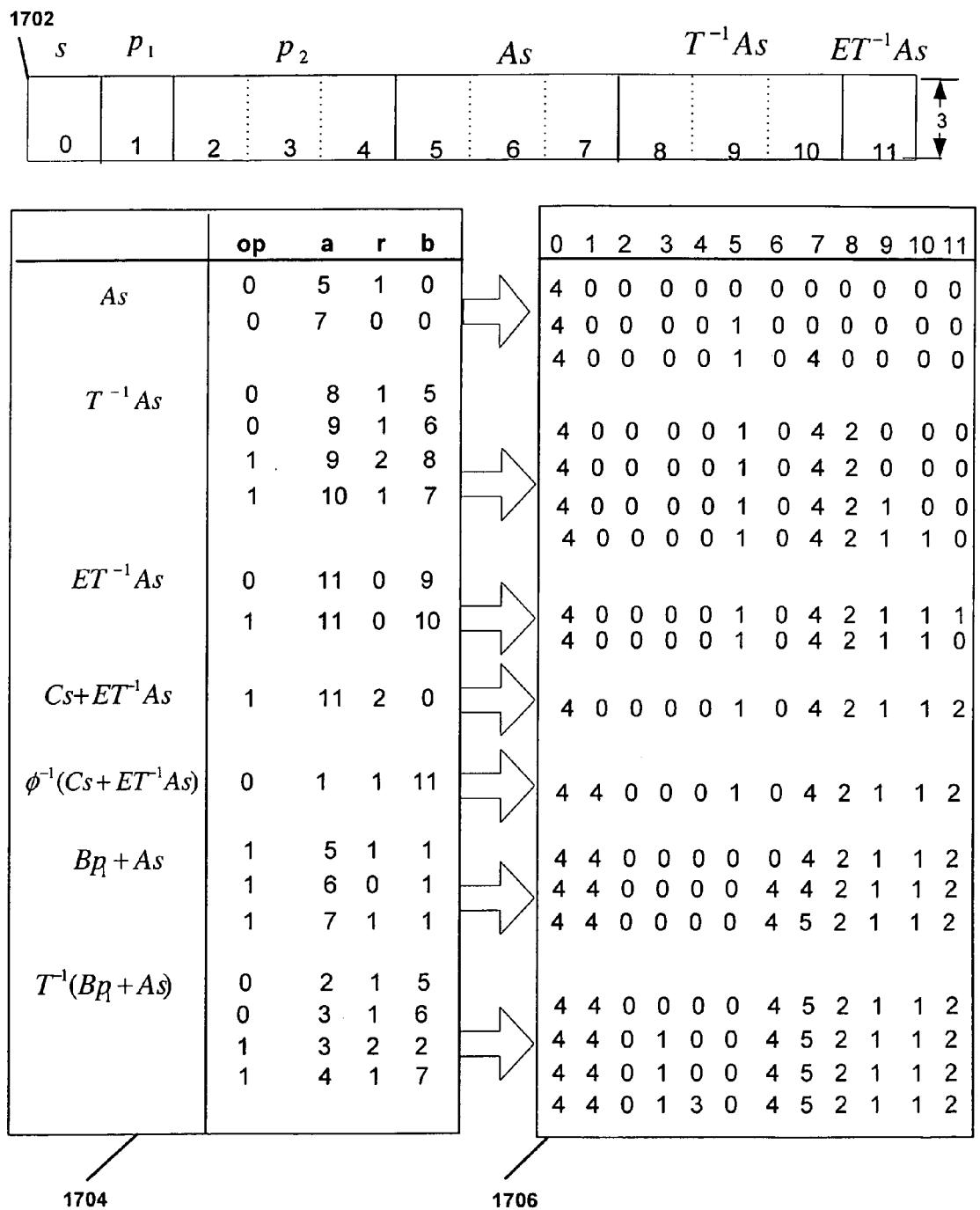
FIG. 15 illustrates an LDPC encoding process as a sequence of operations.

FIG. 15 illustrates the encoding process as a sequence of operations (0 a r b) and (1 a r b) for the vector LDPC code shown in FIG. 11. An exemplary memory 1702 stores information bits, coded bits, and intermediate variables. The content of each of the memory locations 0' through 11' is shown in row 1703 above the corresponding memory location. Memory is of Z-bit data width, i.e., the accessing unit by a simple SIMD instruction is a Z-bit vector and each memory location 0' through 11' holds Z bits. Location 0' of the memory 1702 is assigned to store the single information vector s; location 1' is assigned to store parity vector $p_1$; locations 2' to 4' are assigned to store parity vectors $p'_2$. Additional memory space is provided to hold intermediate values. The exemplary memory 1702 provides locations 5' to 7' to store the value of As and later that of $Bp_1+As$; it provides locations 9' to 11' to store $T^{-1}As$; it provides locations 12' to store $ET^{-1}As$ With respect to the above allocation of memory 1702, the encoding process illustrated in FIG. 14 as matrix multiplication with vectors is decomposed into a sequence of operations (0 a r b) or (1 a r b) listed in Table 1704. For clarity, Table 1704 shows the sequence of instructions together with their respective matrix multiplication counterparts. For example, multiplication As is decomposed to two instructions: (0 5 1 0) followed by (0 7 0 0). Suppose we encode the same information bits as in FIG. 14 by storing s=[100] into location 0, as illustrated in the first row of Table 906. Operations executing instructions (0 5 1 0) and (0 7 0 0) give result As=(001, 000, 100) in locations from 5' to 7', the same as its counterpart in FIG. 14. Table 1706 illustrates the complete encoding process in terms of the content of memory 1702 as the sequence of instructions is executed.

It will be apparent to those skilled in the field that the instructions listed in Table 1704 can be readily translated into a hardware implementation. Numerous variations of the instruction set are possible, including e.g. removing redundancy in the instruction set, adding instructions in the instruction set to avoid initializing the memory, or optimizing the instruction set to conform to memory operation characteristics. Such variations are to be considered within the scope of the invention.

Figure 16:
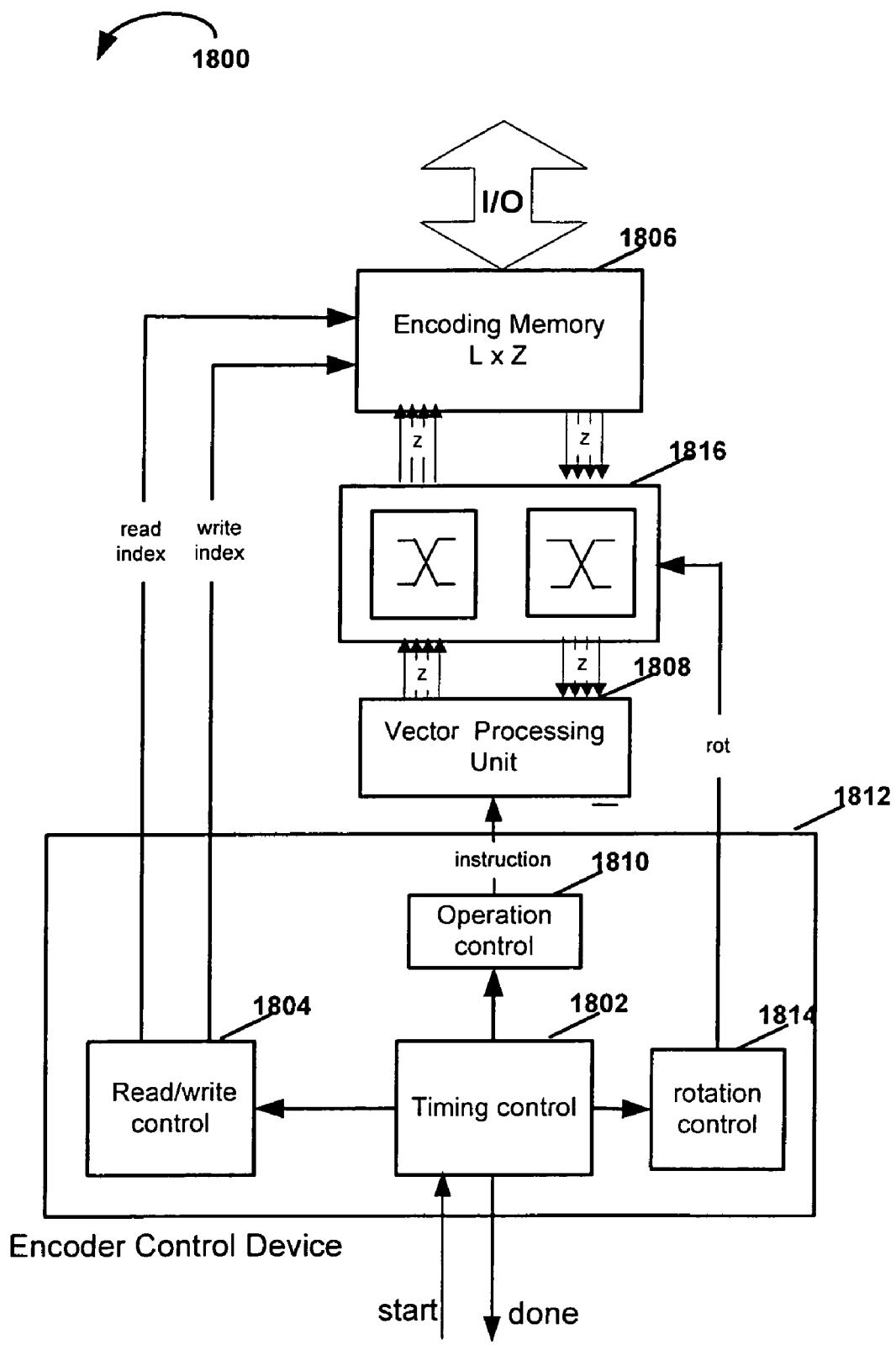
FIG. 16 illustrates an LDPC encoder implemented in accordance with the present invention that vectorizes the encoder of FIG. 7.

FIG. 16 illustrates an encoder 1800 incorporating various features of the present invention. Encoder 1800 fully vectorizes, with rotations, encoder 1000. Note that the figure indicates Z=4 whereas our example has Z=3, in general we may have any Z>1 but in practice Z values of the form $2^k$ for integer k are often preferable. Similarities between encoder 1800 and encoder 1000 are apparent. In particular the encoder control module 1802 and the operation control module 1812 function in the same or similar manner as their respective counterparts 1002 and 1012 in encoder 1000. For example, to encoder LDPC code defined in FIGS. 12 and 13 the operation of these components would be exactly the same as their counterparts in encoder 1000 when encoding the example code 400. The encoding memory 1806 is a vectorized version of its counterparts 1006 in encoder 1000. Whereas, in encoder 1000, the memories stored single bits, the corresponding memories in encoder 1800 store vector sets, i.e., Z-bit vectors. These vectors are written and read as single units using SIMD instructions. Thus, the message identifiers sent to the memory from the ordering control 1804, i.e., memory indices, are equivalent or similar to those in encoder 1000. The ordering control module 1804 has the additional role, beyond that of its counterpart 1004 in encoder 1000, of storing and providing the permutation, e.g., rotation, information. Recall that, in encoding example 400, encoder 1000 stored in its ordering module 1004 the sequence of single steps, which together perform a series of matrix multiplications. Consider using encoder 1800 to encode the code of FIG. 11. The ordering module 1804 would store the same above sequence for accessing Z-bit vectors during encoding, and also store the sequence which describes the rotations associated to the same sequence of Z-bit vectors. This sequence serves as the basis to generate the rot signal which is used by the ordering module 1804 to cause the switch 1816 to rotate vectors. The input buffer 1812 and output buffer 1814 serve the same purpose as buffers 1012 and 1014 respectively, except that data is read and written as vectors. The vector unit operation processor 1008 is the same as its counterpart 1008 in encoder 1000, except it is operating on (clearing, accumulating, or outputting) Z-bit vectors instead of single bits.

Some variations on the encoding methods and apparatus discussed above may result in reduced complexity in the case of some implementations. The following are some variations that may reduce the memory requirement for both the control memory 1804 and the encoding memory 1806 discussed above. An implementation can incorporate one or more of the discussed changes.

1) Simplify the instruction representation:

As described, an encoding instruction set is, in various embodiments, an ordered sequence of two basic instructions (0 a r b) and (1 a r b), which when executed produces the actual encoding. Such an instruction sequence may be generated by consecutively decomposing multiplications of some matrix with some vector into a sequence of basic instructions. Some exemplary decompositions include an overwhelming percentage of sub sequences of the following pattern: $(0\ a\ r_0\ b_0), (1\ a\ r_1\ b_1), \ldots, (1\ a\ r_k\ b_k)$. The repetition of a in this sub-sequence is redundant. This redundancy can be readily removed by modifying the basic instruction. Henceforth, we define two new instructions—(0 0 a) and (1 r a)—as follows: (1 r a) instructs the processor to read out the value at location a, left cyclic-shift it by r, and xor the value to the current value in an accumulator; (0 0 a) instructs the processor to write the current value in the accumulator to location a, and reset the value in the accumulator to zero. The transformation from the old instructions to the new instructions is clear: (0 a r b) is transformed to (1 r b), (0 0 a); and (1 a r b) is transformed to (1 0 a), (1 r b), (0 0 a). Following this rule, the exemplary sequence $(0\ a\ r_0\ b_0), (1\ a\ r_1\ b_1), \ldots, (1\ a\ r_k\ b_k)$ is transformed to $(1\ r_0\ b_0), (1\ r_1\ b_1), \ldots, (1\ r_k\ b_k)$, and (0 0 a), thus removing the redundancy. Transforming the instruction set in this manner can reduce the amount of memory required to implement control memory 1804.

2) Reduce the cardinality of the instruction set:

When treating LDPC encoding as a sequence of matrices and vectors multiplications 1600, we can roughly divide the encoding process into three stages. In the first stage, we obtain $T^{-1}As^T$ by first solving $As^T$ then solving $TZ=As^T$ in the second stage, we obtain $p_1^T$; and in the last stage given $p_1^T$, we obtain $p_2^T$ by solving $Tp_2^T=-As^T-Bp_1^T$, which can be done efficiently using back-substitution. In the original form, matrices and vector multiplications in each stage are decomposed into an instruction subset. A sequential concatenation of those three subsets is the complete instruction set and the end of the instruction set implies the end of encoding process. However, sharing the instruction subset between the first stage and the last stage is possible and thus can reduce the cardinality of the instruction set. First, we note that $T^{-1}As^T$ can be obtained by solving $TP_2{}^T = -As^T - Bp_1{}^T$ if $p_1{}^T$ is initialized to zero. Let us define the sequence of instructions to be the concatenation of the instruction subset for the last stage and for the second stage. So now encoding comprises 1) initialize $p_1{}^T$ to be zero; 2) run the instruction subset for the last stage (obtain $T^{-1}As^T$) 3) run the instruction subset for the second stage (obtain $p_1{}^T$); 4) run the instruction subset for the last stage again (obtain $p_2{}^T$).

This instruction set sharing reduces the control memory 1804, and it will also reduce the encoding memory 1806. It is because $T^{-1}As^T$ is now saved at the location for $p_1{}^T$ and there is no need in saving $As^T$.

Numerous additional variations on the encoding methods and apparatus of the present invention will be apparent to those skilled in the art in view of the above description of the invention. Such variations are to be considered within the scope of the invention.

What is claimed is:

1. An apparatus for performing encoding operations, the apparatus comprising:
   memory including a set of memory locations for storing L sets of Z-bit vectors, where Z is a positive integer greater than one and L is a positive integer;
   a vector unit operation processor including an accumulator and output device for passing computed Z-bit vector to the said memory in response to operation instructions; and
   a switching device coupled to the memory and to the vector unit operation processor, the switching device for passing a Z-bit vector between said memory and said vector unit operation processor in response to switch control information.

2. The apparatus of claim 1, wherein the switching device includes circuitry for performing a vector rotation operation to generate a rotated vector.

3. The apparatus of claim 1, further comprising:
   an ordering control module coupled to said memory for generating read and write indices; and
   an operation control module coupled to said vector unit operation processor for generating unit operation instructions.

4. The apparatus of claim 3, wherein the ordering control module is further coupled to said switch device for generating said switch control information used to control the switching of said at least one vector.

5. The apparatus of claim 3, wherein the ordering control module stores information on the order of vectors are to be read out of the memory and information on the order of vectors are to be written into the memory.

6. The apparatus of claim 3, wherein the ordering control module further stores information on the rotation to be performed on the read-out vectors from said memory by said switch.

7. The apparatus of claim 3, wherein the ordering control module sequentially generates index identifiers, each identifier controlling the memory to access memory locations corresponding to a vector as part of a single SIMD instruction.

8. The apparatus of claim 7, wherein each identifier is a single memory address.

9. The apparatus of claim 3, wherein said operation control module stores operation instructions, each instruction controlling the operation at said vector unit operation processor.

10. The apparatus of claim 9, wherein the operation control module sequentially generates operation instructions, each instruction controlling said vector unit operation processor to perform instructed operations.

11. The apparatus of claim 3, further comprising an encoder control module coupled to said ordering control module, the encoder control module including means for supplying information to said ordering control module used to control the order in which each of the L vectors is to be read out of said memory, their associated rotations, and the order to be written into said memory.

12. The apparatus of claim 11, wherein the encoder control device is further coupled to said operation control module, the encoder control device including means for supplying information to said operation control module used to generate operation instructions.

13. A method of performing encoding operations, the method comprising:
   storing L sets of Z-bit vectors in a memory device, where Z is a positive integer greater than one and L is a positive integer;
   reading one of said sets of Z bit vectors from said stored L sets of Z bit vectors;
   rotating the bits in said read one of said Z bit vectors; and
   operating a vector unit processor to perform a plurality of combining operations to combine the bits of the rotated Z bit vector with a Z-bit vector stored in said vector unit processor to generate a new Z-bit vector.

14. The method of claim 13, further comprising:
   storing said new Z bit vector in said memory device in the place of one of the stored L sets of Z bit vectors.

15. The method of claim 14, further comprising:
   executing a set of stored machine executable instructions to control the rotation of the read Z bit vector.

16. The method of claim 14, further comprising:
   using the executed set of stored machine executable instructions to determine which one of said sets of stored Z bit vectors is to be read from memory.

17. The method of claim 14, wherein said combining operations performed by said vector unit processor are exclusive OR operations.

18. The method of claim 17 wherein said encoding method is a low density parity check encoding method.

19. The method of claim 14, further comprising:
   using the executed set of stored machine executable instructions to determine when one of said sets of stored Z bit vectors is to be read from memory.

20. The method of claim 19, further comprising:
   using the executed set of stored machine executable instructions to determine which one of the stored L sets of Z bit vectors is to be replaced by storing the new Z bit vector in said memory device.

* * * * *

UNITED STATES PATENT AND TRADEMARK OFFICE
CERTIFICATE OF CORRECTION

PATENT NO. : 7,627,801 B2  Page 1 of 1
APPLICATION NO. : 11/174790
DATED : December 1, 2009
INVENTOR(S) : Jin et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1183 days.

Signed and Sealed this

Twenty-first Day of December, 2010

David J. Kappos
*Director of the United States Patent and Trademark Office*